(12) United States Patent
Tanaka et al.

(10) Patent No.: US 7,627,212 B2
(45) Date of Patent: Dec. 1, 2009

(54) OPTICAL INTEGRATED DEVICE

(75) Inventors: Shinsuke Tanaka, Kawasaki (JP);
Kazumasa Takabayashi, Kawasaki (JP); Ayahito Uetake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 12/181,448

(22) Filed: Jul. 29, 2008

(65) Prior Publication Data
US 2009/0052834 A1    Feb. 26, 2009

(30) Foreign Application Priority Data
Aug. 24, 2007    (JP) ............................. 2007-218880

(51) Int. Cl.
G02B 6/34    (2006.01)
G02B 6/26    (2006.01)
G02B 6/42    (2006.01)
G02B 6/10    (2006.01)

(52) U.S. Cl. .............................. 385/37; 385/14; 385/31; 385/39; 385/46; 385/50; 385/129; 385/130; 385/131; 385/132

(58) Field of Classification Search .................... 385/37, 385/132
See application file for complete search history.

(56) References Cited

U.S. PATENT DOCUMENTS

| | | | | |
|---|---|---|---|---|
| 6,434,296 B1 * | 8/2002 | Lupu et al. | ...................... | 385/30 |
| 6,532,324 B2 * | 3/2003 | Lupu et al. | ...................... | 385/30 |
| 6,985,648 B2 * | 1/2006 | Kish et al. | ...................... | 385/14 |
| 7,027,703 B2 * | 4/2006 | Joyner et al. | ................. | 385/129 |
| 7,050,666 B2 * | 5/2006 | Welch et al. | ................... | 385/14 |
| 7,058,246 B2 * | 6/2006 | Joyner et al. | ................... | 385/14 |
| 7,208,770 B2 * | 4/2007 | Kish et al. | ...................... | 257/96 |

(Continued)

FOREIGN PATENT DOCUMENTS

EP    1 111 411 A    6/2001

(Continued)

OTHER PUBLICATIONS

Song, J.H. et al.; "Monolithically Integrated 4×4 INGAASP/INP Laser Amplifier Gate Switch Matrix based on Buried Ridge Strip Waveguides" Japanese Journal of Applied Physics, Tokyo, JP, vol. 43, No. 1A/B, Jan. 15, 2004.

(Continued)

*Primary Examiner*—Ryan Lepisto
(74) *Attorney, Agent, or Firm*—Westerman, Hattori, Daniels & Adrian, LLP.

(57) ABSTRACT

An optical integrated device includes an optical waveguide structure formed on a semiconductor substrate and including a plurality of first channel optical waveguide portions, an optical coupler portion and a second channel optical waveguide portion, a burying layer formed from a semi-insulating semiconductor material and burying the optical waveguide structure therein such that an upper portion thereof forms a flat face and a side portion thereof forms an inclined face having a predetermined angle with respect to the semiconductor substrate, and a plurality of dummy structure bodies provided over a desired region in the proximity of at least an output side of the optical coupler portion so that radiation light from the optical coupler portion is spatially separated from signal light propagating along the second channel optical waveguide portion. The plural dummy structure bodies are provided discretely so as to be buried flat by the burying layer.

12 Claims, 8 Drawing Sheets

U.S. PATENT DOCUMENTS

| | | | |
|---|---|---|---|
| 7,228,043 B2 * | 6/2007 | Shimoda | 385/131 |
| 7,257,304 B2 * | 8/2007 | Bonar et al. | 385/132 |
| 7,330,618 B2 * | 2/2008 | Doerr | 385/37 |
| 7,335,875 B2 * | 2/2008 | Terada et al. | 250/227.11 |
| 2002/0094598 A1 | 7/2002 | Kobayashi et al. | |
| 2004/0038434 A1 | 2/2004 | Kobayashi et al. | |
| 2006/0177953 A1 | 8/2006 | Takeuchi | |
| 2007/0230856 A1 * | 10/2007 | Yamazaki | 385/5 |

FOREIGN PATENT DOCUMENTS

| | | |
|---|---|---|
| FR | 2 800 475 A | 5/2004 |
| GB | 2 322 205 A | 8/1998 |
| JP | 8-181389 A | 7/1996 |
| JP | 2005-223300 A | 8/2005 |
| WO | WO 01/33263 A1 | 5/2001 |

OTHER PUBLICATIONS

Kwang-Ryong Oh et al.: "Insertion-Loss-Free InGaAsP/Inp LD-Gate Optical Switch Arrays" Journal of the Korean Physical Society, vol. 33, Nov. 1, 1998, pp. 350-353.

Extended European Search Report, dated Dec. 8, 2008, of the EP counterpart, European Patent Application No. 08160863.0.

* cited by examiner

US 7,627,212 B2

OPTICAL INTEGRATED DEVICE

CROSS REFERENCE TO RELATED APPLICATION

This application is based on and hereby claims priority to Japanese Application No. 2007-218880 filed on Aug. 24, 2007 in Japan, the contents of which are hereby incorporated by reference.

BACKGROUND

1) Field

This invention relates to an optical integrated device (semiconductor optical integrated device) which includes a high-performance optical multiplexer/demultiplexer semi-insulating buried hetero-structure type semiconductor optical coupler) used, for example, for a bulk optical communication system.

2) Description of the Related Art

At present, research and development for implementing a small-sized high-functional semiconductor optical integrated device by integrating optical active devices (active parts) such as a semiconductor laser, a semiconductor optical amplifier (SOA), an optical modulator and an optical detector and optical passive devices (passive parts) such as an optical waveguide and an optical multiplexer/demultiplexer (optical coupler) on a single semiconductor substrate is being carried out energetically.

In many semiconductor optical integrated devices, a structure is used wherein a plurality of active parts such as semiconductor lasers and SOAs are disposed on a single semiconductor substrate and are coupled by optical waveguides and/or optical multiplexers/demultiplexers (optical couplers).

An example of the structure just described is a semiconductor optical integrated device disclosed in Japanese Patent Laid-Open No. 2005-223300. The semiconductor optical integrated device is formed as an SOA optical gate switch 104, for example, as shown in FIG. 7(A). Referring to FIG. 7(A), the SOA optical gate switch 104 has eight input ports ch1 to ch8 and a single output port ch9 and includes an SOA array (8-ch SOA array) 100 including eight SOAs 100A, a single SOA (1-ch SOA) 101 and a single 8-input 1-output FFC type optical coupler (8×1-ch FFC type optical coupler; hereinafter referred to simply as optical coupler) 102. The components mentioned are connected by optical waveguides 103 to form the SOA optical gate switch 104.

For example, as shown in FIG. 7(A), the SOA optical gate switch 104 has an 8×1-ch optical gate switch function for selecting one signal light from among eight signal lights (input signal lights) individually inputted to the SOAs 100A which form the 8-ch SOA array 100 through the eight input ports ch1 to ch8, amplifying the selected signal light by means of the 1-ch SOA 101 and outputting the amplified signal light as output signal light from the output port ch9.

In particular, the SOA optical gate switch 104 injects current at the same time into one of the eight SOAs (one SOA provided on one of the eight input ports ch1 to ch8) which is a component of the 8-ch SOA array 100 and into the 1-ch SOA 101 thereby to provide optical gain to the signal light propagating along the optical path of the selected SOA, but does not inject current into the remaining seven ones of the SOAs (remaining seven SOAs individually provided on the remaining seven ones of the eight input ports ch1 to ch8) of the 8-ch SOA array 100. Then, by utilizing a high absorption coefficient of the SOAs, signal lights propagating along the optical paths of the remaining seven ones of the SOAs are quenched to implement the optical gate switch function.

Further, for example, as seen in FIG. 7(A), in the SOA optical gate switch 104, signal lights from optical fibers (not shown) are inputted individually to the input ports ch1 to ch8 on the 8ch SOA array 100 side provided on one of device end faces, for example, using a lens or a PLC device (planar light circuit device), and signal light is outputted from the output port ch9 on the 1-ch SOA 101 side provided on the other one of the device end faces to an optical fiber (not shown), for example, using a lens or a PLC device (plane light circuit device).

Incidentally, such an SOA optical gate switch 104 as described above is produced on a single semiconductor substrate (here, InP substrate) 105 wherein the entire device has the [100] plane direction, for example, as seen in FIGS. 7(B) to 7(D), and an optical waveguide structure which forms the SOAs 100A and 101, optical coupler 102 and optical waveguides 103 has a channel waveguide structure wherein an optical active layer (here, InGaAs active layer) 107 and an optical waveguide layer (here, InGaAsP waveguide layer) 110 which individually have a high refractive index are provided as a rectangular core layer in order to secure a high signal light guide efficiency and a single mode property.

In particular, for example, as seen in FIG. 7(B), the optical waveguide structure of the 1-ch SOA 101 has a structure formed by stacking a lower cladding layer (here, n-InP cladding layer) 106, an InGaAs active layer 107 and an upper cladding layer (here, p-InP cladding layer) 108 in order. It is to be noted that also the SOAs 100A which form the 8-ch SOA array 100 individually have an optical waveguide structure similar to that of the 1-ch SOA 101. Further, for example, as seen in FIGS. 7(C) and 7(D), the optical coupler 102 and the optical waveguide 103 individually have an optical waveguide structure wherein the lower cladding layer (here, n-InP cladding layer) 106, InGaAsP waveguide layer 110 and upper cladding layer (here, p-InP cladding layer) 108 are stacked in order.

Further, for example, as seen in FIGS. 7(A) to 7(D), the SOAs 100A and 101 individually have a semi-insulating buried-heterostructure capable of implementing both of a good current injection efficiency and reduction of the dielectric capacitance of the device, and the opposite sides of the channel waveguide structures 100A, 101, 102 and 103 are buried in a burying layer (here, semi-insulating InP burying layer) 109 formed from a semi-insulating semiconductor material (high-resistance semiconductor material).

While the burying layer 109 can be formed by depositing a semi-insulating semiconductor material on the opposite sides of the channel waveguide structures 100A, 101, 102, and 103, for example, using a metal organic chemical vapor deposition method (hereinafter referred to as MOCVD method), where the directions of the channel waveguide structures to be buried have various angles with respect to the crystal face of the substrate as seen in FIG. 7(A), the growth of the burying layer 109 formed from a semi-insulating semiconductor material must be performed using such a method (method wherein an organic chlorine material is added) as disclosed, for example, in Japanese Patent Laid-Open No. 2005-223300.

Here, if the growth of the semi-insulating semiconductor burying layer 109 is carried out using the method disclosed in Japanese Patent Laid-Open No. 2005-223300, then, for example, as seen in FIGS. 7(B) to 7(D), the semi-insulating semiconductor burying layer 109 having a flat face over a width of approximately 10 to 20 μm toward the opposite sides from the center of the waveguide at an upper portion thereof is formed. Then, an inclined face (for example, an inclined face having a determined semiconductor crystal plane direction such as a [311] B face) having a predetermined angle with respect to the substrate 105 is formed at a terminal end (in particular, a side portion of the burying layer 109) of the flat face such that the burying layer 109 does not exist on the outer side of the inclined face.

It is to be noted that Japanese Patent Laid-Open No. Hei 8-181389 discloses a technique wherein, where the opposite sides of a waveguide are buried by a semi-insulating semiconductor material, a dummy portion is formed and the semi-insulating semiconductor material is filled into a groove between the waveguide and the dummy portion such that a portion of a side face of the groove at which the crystal growth speed is high is formed with an increased width, whereby a semiconductor burying structure wherein the opposite sides of the waveguide are buried flat can be implemented even if the semiconductor burying structure is configured from waveguides having directions different from each other. In particular, Japanese Patent Laid-Open No. Hei 8-181389 discloses that the width of a groove to be formed around an optical waveguide is adjusted in response to the direction of the waveguide to cancel the difference in the growth speed arising from a difference in the crystal face azimuth on a mesa side face to form a generally flat burying layer.

SUMMARY

The embodiment provides an optical integrated device including an optical waveguide structure formed on a semiconductor substrate and including a plurality of first channel optical waveguide portions, an optical coupler portion and a second channel optical waveguide portion connected to the plural first channel optical waveguide portions through the optical coupler portion, a semi-insulating semiconductor burying layer formed from a semi-insulating semiconductor material and burying the optical waveguide structure therein such that an upper portion thereof forms a flat face having a predetermined width and a side portion thereof forms an inclined face having a predetermined angle with respect to the semiconductor substrate, and a plurality of dummy structure bodies provided over a desired region in the proximity of at least an output side of the optical coupler portion so that radiation light from the optical coupler portion is spatially separated from signal light propagating along the first channel optical waveguide portion or the second channel optical waveguide portion, the plural dummy structure bodies being provided discretely so as to be buried flat by the semi-insulating semiconductor burying layer.

BRIEF DESCRIPTION OF THE DRAWINGS

FIGS. 1(A) and 1(B) are schematic views showing a configuration of an optical integrated device (8-input 1-output SOA gate array integrated device) according to a first embodiment, and wherein FIG. 1(A) is a top plan view of the optical integrated device and FIG. 1(B) is a sectional view taken along line B-B of FIG. 1(A);

FIGS. 3(A) to 3(F) are schematic sectional views illustrating a configuration of and a fabrication method for various portions of the optical integrated device (8-input 1-output SOA gate array integrated device) according to the first embodiment, and wherein FIGS. 3(A) to 3(C) illustrate configurations of and a fabrication method for channel optical waveguide portions, an optical coupler portion and dummy structure bodies and FIGS. 3(D) to 3(F) illustrate a configuration of and a fabrication method for an SOA section;

FIGS. 4(A) and 4(B) are schematic views showing a configuration of an optical integrated device (1-input 8-output SOA gate array integrated device) according to a second embodiment, and wherein FIG. 4(A) is a top plan view of the optical integrated device and FIG. 4(B) is a sectional view taken along line B-B of FIG. 4(A);

FIGS. 7(A) to 7(D) are schematic views showing a configuration of an 8-input 1-output SOA gate array integrated device having a conventional semi-insulating burying structure, and wherein FIG. 7(A) is a top plan view of the 8-input 1-output SOA gate array integrated device, FIG. 7(B) is a sectional view taken along line B-B of FIG. 7(A), FIG. 7(C) is a sectional view taken along line C-C of FIG. 7(A), and FIG. 7(D) is a sectional view taken along line D-D of FIG. 7(A)

DESCRIPTION OF THE PREFERRED EMBODIMENTS

In the following, optical integrated devices according to embodiments are described with reference to the drawings.

First Embodiment

First, an optical integrated device according to a first embodiment is described with reference to FIGS. 1 to 3(F).

The optical integrated device (semiconductor optical device, semiconductor optical integrated device) according to the embodiment is, for example, a semiconductor optical amplifier (SOA) gate array integrated device, and the SOA gate array integrated device is mounted on a mounting substrate, for example, together with a wiring substrate, a lens array and so forth so as to form an SOA optical gate switch (optical module: here, 8×1-ch SOA optical gate switch).

In particular, the present SOA gate array integrated device is an 8-input 1-output SOA gate array integrated device (8×1-ch SOA gate array integrated device) which includes an optical coupler integrated in the inside thereof, the SOA gate array integrated device having a burying structure that an optical waveguide structure for guiding signal light is buried in and by a semi-insulating semiconductor burying layer. As shown in FIG. 1(A), the SOA gate array integrated device is configured such that an optical waveguide structure (channel optical waveguide structure) 4 including a plurality of (here, eight) input channel optical waveguide portions (first channel optical waveguide portions) 1, an optical coupler portion 2 and an output channel optical waveguide portion (second channel optical waveguide portion) 3 connected to the plural input channel optical waveguide portions 1 through the optical coupler portion 2 are formed on the same semiconductor substrate 5 (here, n-InP substrate).

Here, the optical coupler portion 2 has a function of optically coupling signal light having propagated along the plural input channel optical waveguide portions 1 to the single output channel optical waveguide portion 3, and is formed particularly from an 8-input 1-output FFC coupler (8×1-ch FFC coupler).

Figure 1B:
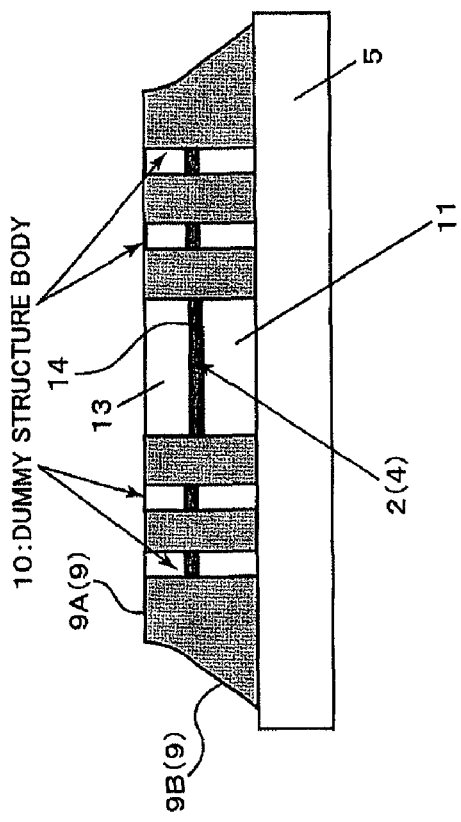
Figure 1A:
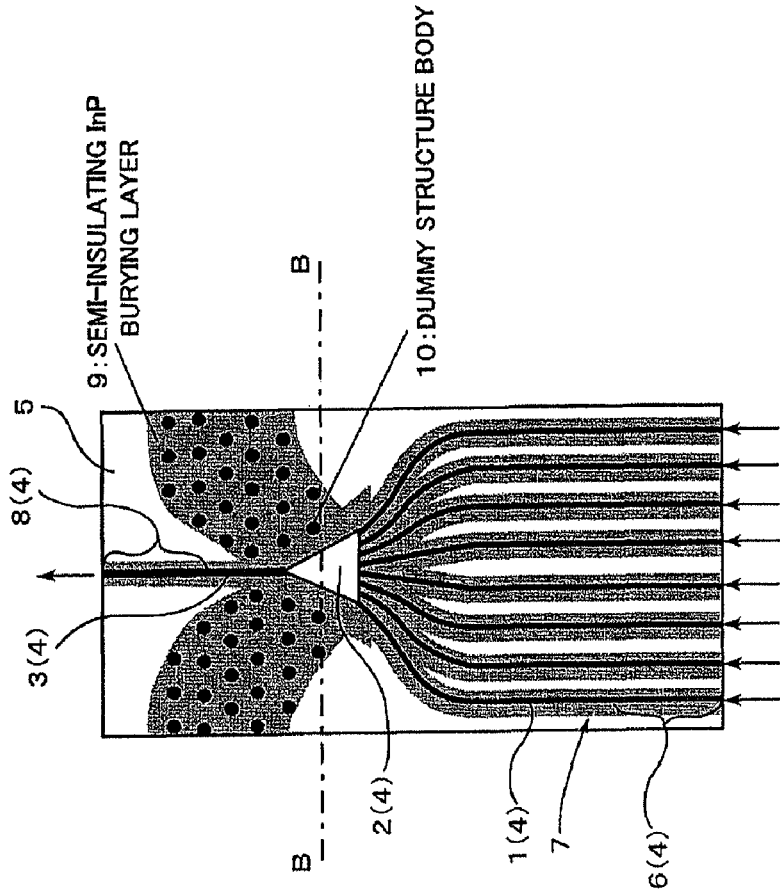

Meanwhile, the input channel optical waveguide portions 1, optical coupler portion 2 and output channel optical waveguide portion 3 have an optical waveguide structure wherein, as shown in FIG. 1(B), an n-InP cladding layer 11, an i-InGaAsP optical waveguide core layer 14, and a p-InP cladding layer 13 are stacked in order on an n-InP substrate 5. It is to be noted that FIG. 1(B) shows the optical waveguide structure of the optical coupler portion 2.

Further, in the embodiment, each of the plural (here, eight) input channel optical waveguide portions 1 includes an SOA portion 6 having an electrode provided on a surface thereof as seen in FIG. 1(A). The plural (here, eight) SOA portions (switching SOA portions) 6 form an SOA gate array 7 (in which a plurality of SOAs are disposed in parallel; optical switch device; 8-ch SOA array). Meanwhile, the single output channel optical waveguide portion 3 includes a semiconductor optical amplifier (SOA) portion (amplifying SOA portion; 1-ch SOA) 8 for amplifying signal light to be outputted (output signal light).

Figure 3A:
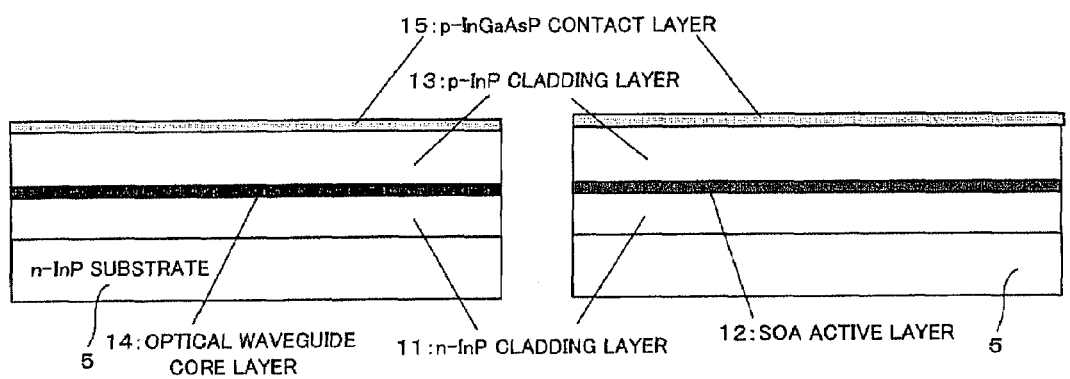
Figure 3D:
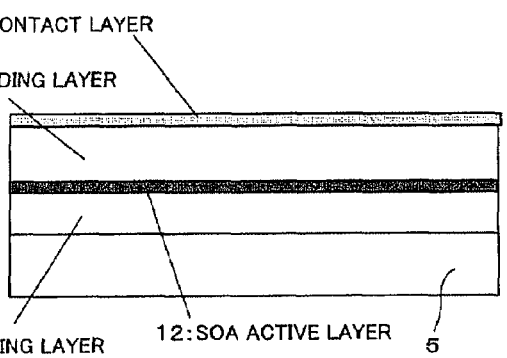
Figure 3B:
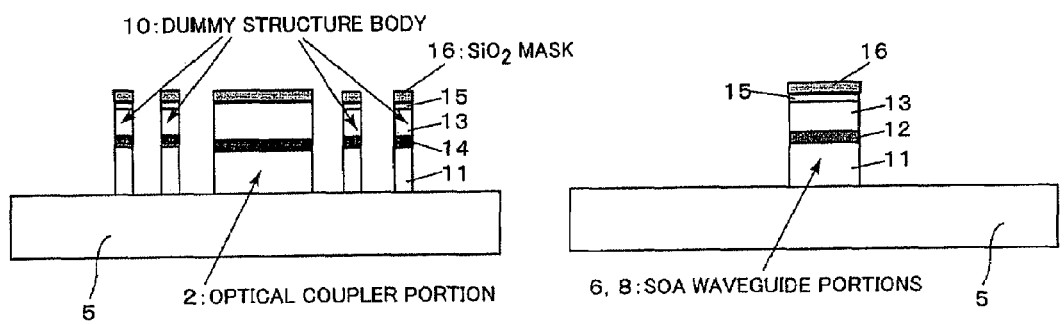
Figure 3E:
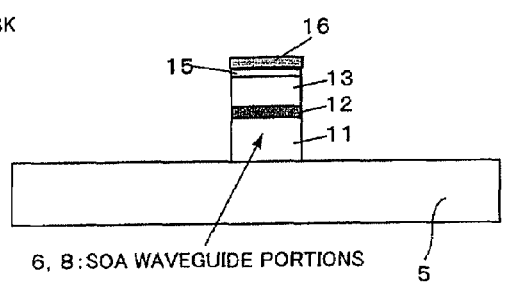
Figure 3C:
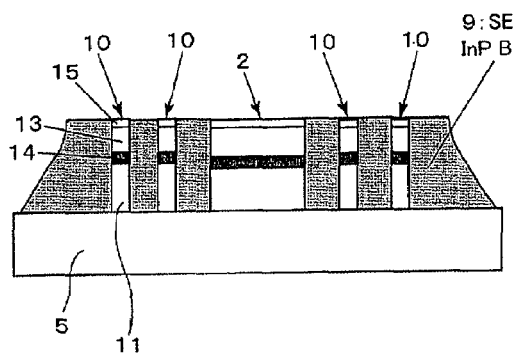
Figure 3F:
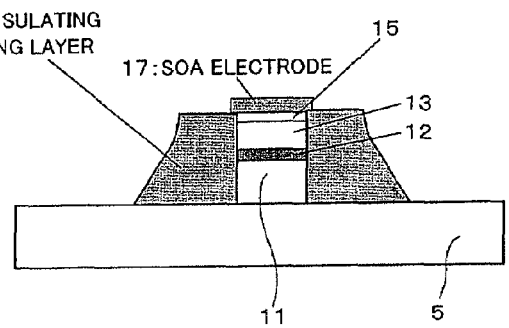

Here, the SOA portions 6 and 8 have an optical waveguide structure wherein an n-InP cladding layer 11, an SOA active layer 12, and a p-InP cladding layer 13 are stacked in order on the n-InP substrate 5 (Refer to FIG. 3(F)).

It is to be noted here that, while the SOA portion 8 is provided on the output channel optical waveguide portion 3, this SOA portion may not be provided.

Meanwhile, the circumference (the opposite sides) of the optical waveguide structure (mesa structure) 4 is buried by a semi-insulating semiconductor burying layer (here, semi-insulating InP burying layer; high-resistance semiconductor burying layer) 9 made of a semi-insulating semiconductor material (high-resistance semiconductor material) and grown, for example, by a metal organic chemical vapor deposition method (hereinafter referred to as MOCVD method) as seen in FIG. 1(B), and a semi-insulating semiconductor burying structure (high-resistance semiconductor burying structure) is formed thereby. In short, the present optical integrated device includes a high-resistance burying type semiconductor optical coupler.

It is to be noted that, in the present SOA gate array integrated device, since the plural input channel optical waveguide portions 1 have different angles with respect to the crystal plane direction of the substrate 5, the growth of the burying layer 9 is carried out using such a method (method of adding an organic chlorine material) as disclosed, for example, in Japanese Patent Laid-Open No. 2005-223300, the entire contents thereof being hereby incorporated by reference.

Here, an upper portion of the semi-insulating semiconductor burying layer 9 forms a flat face 9A having a predetermined width (fixed width) as seen in FIG. 1(B), and the opposite side portions of the semi-insulating semiconductor burying layer 9 are each formed so as to have an inclined face 9B having a predetermined angle (fixed angle) with respect to the semiconductor substrate 5. Particularly, the semi-insulating semiconductor material (here, InP) of the burying layer 9 is doped with an element which forms a deep impurity level in a band thereof (for example, for InP, with Fe or Ru).

Incidentally, the SOA optical gate switch 104 having such a structure as described in Japanese Patent Laid-Open No. 2005-223300 exhibits a phenomenon that, when it operates, radiation light generated in the optical coupler 102 (leakage component of signal light from the optical coupler 102) is reflected on the boundary (air-semiconductor boundary surface) between the burying layer 109 and the air and propagates in the burying layer 109 until it optically couples to an output fiber (not shown) in such a form that it is mixed into the signal light by an output end face on the 1-ch SOA 101 side.

Figure 8:
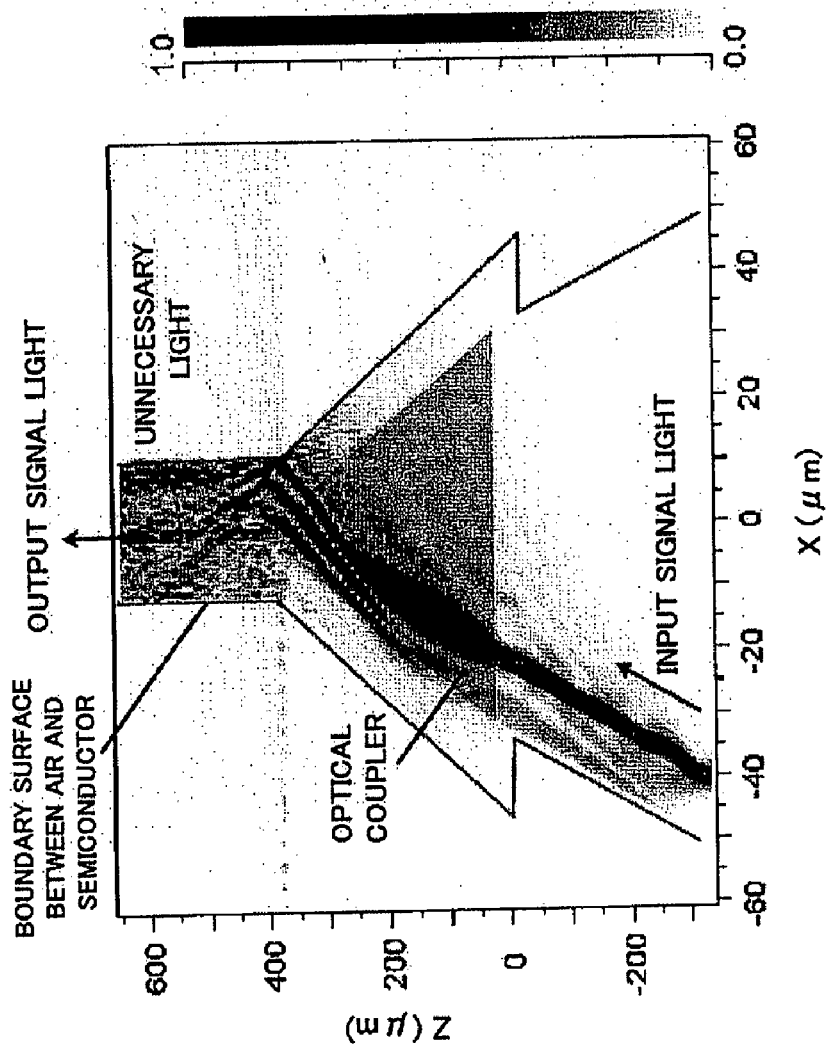
FIG. 8 is a view illustrating a result of simulation calculation of a manner of signal light propagation at and around an optical coupler portion of the 8-input 1-output SOA gate array integrated device having the conventional semi-insulating burying structure.

Here, FIG. 8 illustrates a result of simulation calculation where a manner of propagation of signal light around the optical coupler 102 when the signal light is inputted to the outermost SOA 100A of the 8-ch SOA array 100 is calculated by a simulation calculation using a BPM (Beam Propagation Method).

FIG. 8 illustrates a manner wherein the greater part of radiation light generated in the optical coupler 102 (component of light leaking from the optical waveguide structure which forms the optical coupler 102 to the outside; unnecessary light) is reflected on the boundary (air-semiconductor boundary surface) between the burying layer 109 existing on the outer side by 10 μm with respect to the center of the waveguide and the air, and the unnecessary light (radiation light) which should originally emerge to the outside of the device is confined in the second channel waveguide 111 defined by the air-semiconductor boundary surface on the left and right of a region on the 1-ch SOA 101 side and propagates together with the signal light propagating along the optical waveguide 103 and the 1-ch SOA 101.

The unnecessary light (radiation light) is coupled to an optical fiber (not shown) together with the signal light (output signal light) at a fixed proportion in an optical fiber coupling portion (for example, an optical coupling portion for which a lens is used) on the device end face on the 1-ch SOA 101 side. Therefore, the unnecessary light (radiation light) makes a stray light component which is inputted to the output fiber (not shown) also when the SOA optical gate switch 104 is in an off state and makes a cause of remarkably degrading the extinction ratio between on and off states of the SOA optical gate switch 104.

Particularly, in an optical switch system in which the SOA optical gate switch 104 is used, where such SOA optical gate switches 104 are connected at multi-stages and the number of input and output ports is increased, in order to avoid inter-port signal light interference, a very high on-off extinction ratio is required for the SOA optical gate switch 104.

Therefore, degradation of the extinction ratio of the SOA optical gate switch 104 caused by the phenomenon described above is a serious problem in the optical switch system, and it is a significant subject to improve the on-off extinction ratio of the SOA optical gate switch 104 while the other device characteristics (optical gain, noise figure, power consumption and so forth) are maintained.

In order to solve the subject just described, it is effective to eliminate the air-semiconductor boundary surface existing around the optical coupler 102 such that the region of the boundary surface is formed in a flat structure having no discontinuity so that the reflective index does not change within the region thereby to suppress the phenomenon that the radiation light (unnecessary light) from the optical coupler 102 is reflected and is confined in and propagates along the second channel waveguide 111.

Thus, it seems a possible countermeasure to apply, for example, the method disclosed in Japanese Patent Laid-Open No. Hei 8-181389. In particular, in order to form a portion around the optical coupler 102 in a flat structure, such a countermeasure as to form a groove around the optical coupler 102 while the outer side of the groove is formed as a dummy portion and the formed groove is buried by the semi-insulating semiconductor burying layer 109 may be taken.

However, in an optical device which has a complicated waveguide structure (mesa structure) having various waveguide angles with respect to a crystal plane direction like such an SOA optical gate switch 104 as described above, it is very difficult to form a generally flat burying layer using such a method as disclosed in Japanese Patent Laid-Open No. Hei 8-181389.

In particular, where such a method as disclosed in Japanese Patent Laid-Open No. Hei 8-181389 is used, it is substantially impossible to carry out burying growth so that the growth face of layer burying a groove formed around the optical coupler 102 and the optical waveguide (including a curved waveguide) 103 becomes flat over the overall region, and there is the possibility that a void caused by insufficient growth and a local swelling of a burying layer may appear in some region of the device.

In this manner, if the burying growth cannot be carried out flat without a void, then various characteristics of the device are degraded drastically. Further, also formation of an electrode becomes difficult.

Accordingly, it is difficult to apply the method disclosed in Japanese Patent Laid-Open No. Hei 8-181389 in order to solve the subject described above. Further, it is difficult to eliminate the air-semiconductor boundary surface existing around the optical coupler 102 while securing the flatness of the burying layer 109 and suppress the phenomenon that radiation light (unnecessary light) from the optical coupler 102 is confined in and propagates along the second channel waveguide 111, and it is a subject to implement solution to the problems described above.

It is to be noted here that, while the foregoing description is given taken the SOA optical gate switch 104 as an example, the subject described above is not unique to SOA optical gate switches. In particular, there is a subject similar to that described above, for example, also in a device wherein a laser or an optical modulator is integrated in place of an SOA or another device formed from an optical coupler such as an MMI (Multi-Mode Interfere) coupler or a star coupler in place of an FFC coupler.

Therefore, in the embodiment, as seen in FIG. 1(A) a plurality of dummy structure bodies 10 are provided discretely (discontinuously) over a desired region on the opposite sides in the proximity of at least the output side of the optical coupler portion 2 on the n-InP substrate 5 in addition to the optical waveguide structure 4.

Further, the circumference of the dummy structure bodies 10 is buried by the burying layer 9 together with the optical waveguide structure 4 described hereinabove as seen in FIGS. 1(A) and 1(B).

In particular, as seen in FIGS. 1(A) and 1(B), the plural dummy structure bodies 10 are provided discretely over a desired region such that each of the inclined faces 9B of the burying layer 9 is not formed in the proximity of at least the output side of the optical coupler portion 2 [that is, the boundary between the burying layer 9 and the air (boundary of each inclined face 9B of the burying layer 9) is formed at a position spaced by a desired distance from the proximity of at least the output side of the optical coupler portion 2].

Consequently, the boundary between the burying layer 9 and the air (air-semiconductor boundary surface; inclined face 9B of the semi-insulating semiconductor burying layer 9) which makes a principal cause in that radiation light from the optical coupler portion 2 (leakage component of signal light from the optical coupler portion 2; component of light leaking to the outside from the optical waveguide structure 4 which forms the optical coupler portion 2) is guided in the burying layer 9 along the output side optical waveguide structure 4 (output channel optical waveguide portion 3 and SOA portion 8) is not formed in the proximity of at least the output side of the optical coupler portion 2, and the radiation light can be guided to a position separated spatially from signal light (output signal light), which propagates in the output channel optical waveguide portion 3, and eliminated to the outside. It is to be noted that the radiation light is eliminated to the outside, for example, by radiation or the like also when the radiation light is guided in the burying layer 9 in which the dummy structure bodies 10 are buried.

In this manner, it is possible to prevent such a situation that the radiation light radiated from the optical coupler portion 2 to the burying layer 9 is reflected by the air-semiconductor boundary surface and propagates in the inside of the burying layer 9 formed along the output side optical waveguide structure 4 (output channel optical waveguide portion 3 and SOA portion 8) toward the output end face side. Consequently, a device characteristic (here, extinction ratio) can be improved.

More particularly, the plural dummy structure bodies 10 are provided discretely over a wide region from the proximity of the optical coupler portion 2 to the proximity of the side faces of the semiconductor substrate 5 as seen in FIG. 1(A).

Since the arrangement is devised such that the dummy structure bodies 10 are distributed over a region from the proximity of the optical coupler portion 2 to the proximity of the device side faces in this manner, it is possible for the radiation light radiated from the optical coupler portion 2 to be excluded to the outside from a location (here, device side faces) remote from the output ports formed on the device end face through the region in which the dummy structure bodies 10 are formed under the guidance of the optical waveguide whose waveguide core is formed from the burying layer 9 formed around the dummy structure bodies 10 (since the upper face and the side faces of the burying layer 9 contact with the air, the burying layer 9 functions as a waveguide core, and an optical waveguide is defined by the semi-insulating semiconductor burying layer 9 and the air).

Here, the plural dummy structure bodies 10 are selectively provided only in a region in which radiation light (unnecessary light) from the optical coupler portion 2 is generated in high intensity. In particular, the plural dummy structure bodies 10 are provided in a region from which radiation lights from the optical coupler portion 2 originating from signal lights inputted individually from the plural input channel optical waveguide portions 1 to the optical coupler portion 2 are outputted.

Particularly, in the embodiment, the layer structure of the dummy structure bodies 10 is same as that of the optical waveguide structure 4 (input channel optical waveguide portions 1, output channel optical waveguide portion 3 and optical coupler portion 2) so that the dummy structure bodies 10 can be produced readily. In this instance, if it is taken into consideration that scattering of light occurs or the capacitance increases, then preferably the size of the dummy structure bodies 10 is minimized as far as the dummy structure bodies 10 which function as such can be formed.

Therefore, in the embodiment, each of the dummy structure bodies 10 is formed in a columnar shape (columnar structure; columnar type) as seen in FIG. 1(B), and the diameter thereof is set substantially equal to (for example, diameter of approximately 3 μm) or smaller than the width of the input channel optical waveguide portions 1 or the output channel optical waveguide portion 3. It is to be noted that the shape of the dummy structure bodies 10 need not be a columnar shape, but may be, for example, a prismatic column shape. Where such a columnar shape as described above is adopted, the burying layer 9 which is uniform over a wide region (for example, region of a diameter of approximately 30 μm) around the comparatively small dummy structure bodies (for example, of a diameter of approximately 3 μm) can be formed.

Further, in the embodiment, the plural dummy structure bodies 10 are disposed such that the distance therebetween (arrangement distance) may be equal to or greater than approximately 10 μm but equal to or smaller than approximately 50 μm. It is to be noted that also the distance between the optical waveguide structure 4 including the optical coupler portion 2 and the output channel optical waveguide portion 3 and the dummy structure bodies 10 is set similarly.

If the distance between each adjacent ones of the dummy structure bodies 10 is within the range given above, then it is possible to form the burying layer 9, which is uniform and flat over a very great area, using overlapping of the burying layer 9 formed around the dummy structure bodies 10. It is to be noted that, even if such columnar dummy structure bodies 10 exist somewhat densely and somewhat great number of overlapping regions exist as in the embodiment, if such a method as disclosed in Japanese Patent Laid-Open No. 2005-223300 (method of adding an organic chlorine material) is used to carry out burying growth, then the possibility that some fault may be caused by abnormal growth or the like is very low.

Here, the reason why the arrangement distance of the dummy structure bodies 10 is set equal to or greater than approximately 10 μm is that, if the arrangement distance is smaller than approximately 10 μm, then it is estimated that the growth speed in the regions between the columnar dummy structure bodies 10 is excessively low thereby burying in a realistic period of growth time becomes impossible. Meanwhile, the reason why the arrangement distance between the dummy structure bodies 10 is set equal to or smaller than approximately 50 μm is that, if the arrangement distance is greater than approximately 50 μm, then it is estimated that the regions between the dummy structure bodies 10 become excessively great and much time is required to bury the regions thereby burying within a realistic period of growth time becomes impossible.

In order to form such dummy structure bodies 10 as described above, a mask (waveguide mesa forming mask) used to form the optical waveguide structure 4, which forms the optical coupler portion 2, input channel optical waveguide portions 1, output channel optical waveguide portion 3 and SOA portions 6 and 8, should be produced in such a form that it additionally includes a mask pattern for forming the plural dummy structure bodies 10 (in such a form that patterns of a desired shape are additionally provided at positions at which the dummy structure bodies 10 are to be formed).

Then, at a step (waveguide mesa forming step) of forming the optical waveguide structure 4, which includes the optical coupler portion 2, input channel optical waveguide portions 1, output channel optical waveguide portion 3 and SOA portions 6 and 8, when a mask is used to carry out, for example, dry etching to form the optical waveguide structure 4 (here, the optical coupler portion 2, input channel optical waveguide portions 1 and output channel optical waveguide portion 3), the mask including the dummy structure forming patterns is used to form also the dummy structure bodies 10 of the mesa shape (columnar shape) simultaneously.

After the dummy structure bodies 10 are formed in such a manner as described above, when burying growth is carried out using, for example, an MOCVD method to bury the optical waveguide structure 4, which includes the optical coupler portion 2, input channel optical waveguide portions 1, output channel optical waveguide portion 3 and SOA portions 6 and 8, by the semi-insulating semiconductor burying layer 9 (here, semi-insulating InP layer), the circumference of the optical waveguide structure 4 is buried by the semi-insulating semiconductor burying layer 9 as seen in FIGS. 1(A) and 1(B) and also the circumference of the plural dummy structure bodies 10 is buried by the semi-insulating semiconductor burying layer 9.

Further, in the embodiment, since the plural dummy structure bodies 10 are disposed discretely at desired distances over a desired region on the opposite sides in the proximity of at least the output side of the optical coupler portion 2, the region in which the dummy structure bodies 10 are formed is buried flat without any void (continuously) by the semi-insulating semiconductor burying layer 9.

In particular, in the present SOA gate array integrated device, if burying growth is carried out in such a condition that the region in which the plural input channel optical waveguide portions 1 having various waveguide angles with respect to the crystal plane direction are formed is buried flat without any void similarly as in the conventional structure wherein the dummy structure bodies 10 are not provided, then the burying layer 9 which is uniform and flat over a desired region in the proximity of at least the output side of the optical coupler portion 2 is formed. Consequently, the burying layer 9 which is flat and uniform over an overall area of an upper portion thereof and which is difficult to form can be formed readily.

Since the burying layer 9 which is uniform and flat can be formed also around the optical coupler portion 2, input channel optical waveguide portions (including curved waveguide portions) 1, output channel optical waveguide portion 3 and SOA portions 6 and 8, the other device characteristics are not deteriorated.

Since the uniform and flat burying layer 9 can be formed over a desired region in this manner, an air-semiconductor boundary surface in the proximity of an optical coupler which is a subject of the conventional structure is not formed as seen in FIG. 1(A). Therefore, a channel waveguiding effect that radiation light (unnecessary light) is reflected by the air-semiconductor boundary surface in the proximity of the optical coupler and is then guided in the inside of the burying layer 9 (burying layer 9 which functions as a second channel waveguide) formed along the output side optical waveguide structure 4 (output channel optical waveguide portion 3 and SOA portion 8) toward the output end face side can be reduced significantly.

Consequently, the present SOA optical gate switch is improved in terms of the extinction ratio between on and off states (device extinction ratio).

Figure 2:
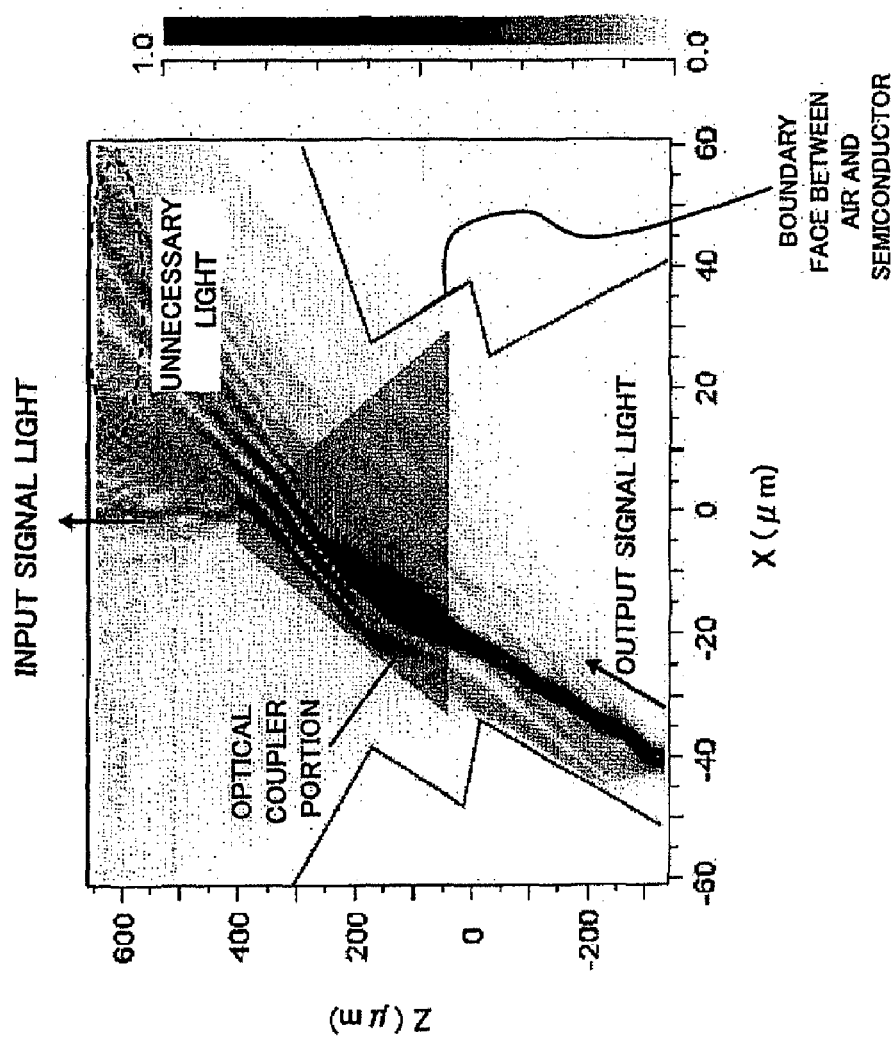
FIG. 2 is a view illustrating a result of simulation calculation of a manner of signal light propagation at and around an optical coupler portion of the optical integrated device (8-input 1-output SOA gate array integrated device) according to the first embodiment.

Here, FIG. 2 illustrates a result of simulation calculation where, when signal light is inputted to the outermost SOA portion 6 of the 8-ch SOA array 7 in the structure to which the present invention is applied [structure wherein the dummy structure bodies 10 are provided; refer to FIGS. 1(A) and 1(B)], simulation calculation of a manner of propagation of the signal light around the optical coupler portion 2 is carried out by a BPM (Beam Propagation Method).

Referring to FIG. 2, when compared with the calculation result (refer to FIG. 8) on the conventional structure (structure which does not have any dummy structure), it can be seen that reflection of unnecessary light (radiation light) on the air-semiconductor boundary surface and a channel wave guiding effect by the burying layer 9 on the output end face side (1-ch SOA 8 side) are suppressed apparently and unnecessary light (radiation light) which propagates around the output signal light on the output end face side (1-ch SOA 8 side) is reduced significantly.

In the following, a fabrication method for the optical integrated device (SOA gate array integrated device having dummy structure bodies) according to the embodiment is described with reference to FIGS. 3(A) to 3(F).

First, an n-InP cladding layer 11 (layer thickness: approximately 300 nm), an SOA active layer 12 and a p-InP cladding layer 13 (layer thickness: approximately 300 nm) are grown successively on an n-InP substrate 5 (n-InP substrate) having the n conduction type as seen in FIG. 3(D) using, for example, an MOCVD method.

Here, as the SOA active layer 12, an i-InGaAsP lower SCH layer (layer thickness: approximately 100 nm, compositional wavelength: 1.3 μm), an i-InGaAsP active layer (layer thickness: approximately 50 nm, compositional wavelength: 1.58 μm) and an i-InGaAsP upper SCH layer (layer thickness: 100 nm, compositional wavelength: 1.3 μm) are successively grown.

Then, a SiO$_2$ mask is formed only over regions within which the SOA portions 6 and 8 are to be formed, and the p-InP cladding layer 13 and the SOA active layer 12 of the layer structure formed in the remaining regions (regions within which the input channel optical waveguide portions 1, output channel optical waveguide portion 3 and optical coupler portion 2 are to be formed) are removed, for example, by wet etching. Then, in the regions from which the p-InP cladding layer 13 and the SOA active layer 12 are removed, an i-InGaAsP optical waveguide core layer 14 (layer thickness: approximately 200 nm, compositional wavelength: 1.3 μm) and a p-InP cladding layer 13 (layer thickness: approximately 300 nm) are butt joint grown in order from below in order to form the optical waveguide structure 4 which includes the optical coupler portion 2, input channel optical waveguide portions 1 and output channel optical waveguide portion 3 as seen in FIG. 3 (A), for example, by an MOCVD method.

Then, after the SiO$_2$ mask is removed, a p-InP cladding layer 13 (layer thickness: approximately 2 μm) and a p-InGaAsP contact layer 15 (layer thickness: approximately 500 nm, formation wavelength: 1.3 μm) are successively grown over an overall area of the wafer as seen in FIGS. 3(A) and 3(D), for example, by an MOCVD method. Consequently, a layer structure which forms the optical coupler portion 2, input channel optical waveguide portions 1 and output channel optical waveguide portion 3 is produced as seen in FIG. 3(A) and another layer structure which forms the SOA portions 6 and 8 is produced as seen in FIG. 3(D).

Thereafter, production of the optical waveguide structure 4, for example, by dry etching is carried out.

First, a SiO$_2$ mask 16 having a mask pattern for forming the optical waveguide structure 4 which forms the SOA portions 6 and 8, optical coupler portion 2, input channel optical waveguide portions 1 and output channel optical waveguide portion 3 and another mask pattern for forming the dummy structure bodies 10 is formed.

In the embodiment, the mask patterns for forming the dummy structure bodies 10 are circular patterns and are provided discretely over a region from the proximity of the optical coupler portion 2 to the proximity of the device side end face.

Thereafter, dry etching such as, for example, ICP-RIE (Inductively Coupled Plasma Reactive Ion Etching) is carried out using the SiO$_2$ mask 16 to form a waveguide mesa structure of, for example, a height of approximately 3 μm [optical waveguide structure 4 which forms the SOA portions (SOA waveguide portions) 6 and 8, optical coupler portion (optical coupler waveguide portion) 2, input channel optical waveguide portions 1 and output channel optical waveguide portion 3] and the columnar dummy structure bodies 10 as seen in FIGS. 3(B) and 3(E). It is to be noted that FIG. 3(B) shows a sectional structure of the optical coupler portion 2.

Then, a semi-insulating InP burying layer [SI (Semi-Insulating)—InP block layer: high-resistance InP burying layer] 9 doped, for example, with Fe is grown to bury the circumference of the optical waveguide structure 4 and the columnar dummy structure bodies 10 uniformly and flat with the semi-insulating InP burying layer 9 as seen in FIGS. 3(C) and 3(F), for example, by an MOCVD method.

Thereafter, an electrode (SOA electrode) 17 having a structure similar to that used, for example, in a popular semiconductor laser is formed over the upper portions (that is, just above the SOA active layer 12) of the regions in which the SOA portions 6 and 8 to be are formed.

Furthermore, cutting out of a chip (device) is carried out by cleavage, and AR (Anti-Reflection) coating for preventing reflection of signal light is applied to the end faces of the device on the input and output sides, thereby to complete an SOA gate array integrated device as an optical integrated device.

Accordingly, with the optical integrated device (SOA gate array integrated device) according to the embodiment, there is an advantage that the optical integrated device (SOA gate array integrated device) which includes the optical coupler portion 2 and has a burying structure by the semi-insulating semiconductor burying layer 9 can assure the flatness of the semi-insulating semiconductor burying layer 9 while such a phenomenon that radiation light generated from the optical coupler portion 2 mixes into signal light on the output side can be suppressed. Particularly where the optical integrated device is an SOA gate array integrated device and forms an SOA optical gate switch, the extinction ratio between on and off states (device extinction ratio: device characteristic) is improved.

Second Embodiment

Now, an optical integrated device according to a second embodiment is described with reference to FIGS. 4(A) to 6.

The optical integrated device according to the embodiment is different from that of the first embodiment described hereinabove in that it is a 1-input 8-output SOA gate array integrated device (1×8-ch SOA gate array integrated device) while the optical integrated device of the first embodiment is an 8-input 1-output SOA gate array integrated device (8×1-ch SOA gate array integrated device).

Figure 4B:
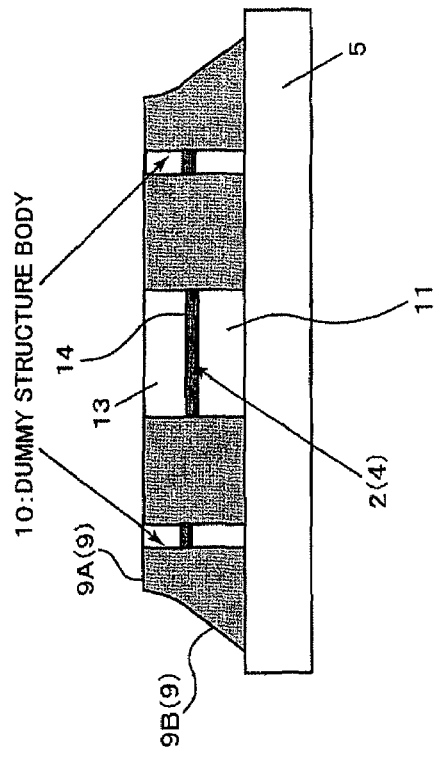
Figure 4A:
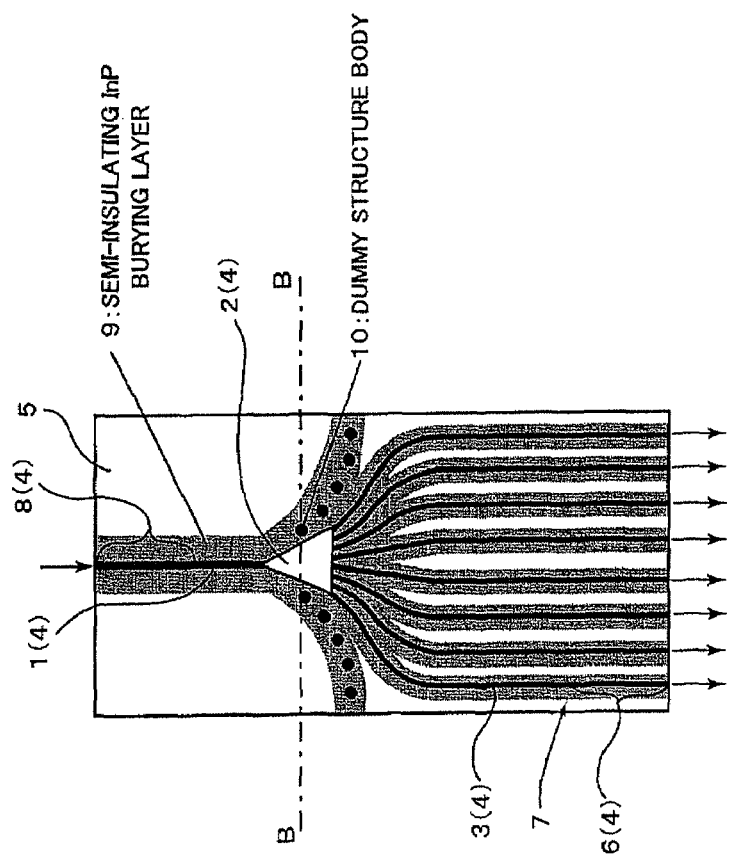

In particular, the basic configuration of the present SOA gate array integrated device, that is, the configuration of the optical coupler portion 2, input channel optical waveguide portion 1, output channel optical waveguide portions 3 and SOA portions 6 and 8, is same as that of the first embodiment described hereinabove as seen in FIGS. 4(A) and 4(B). It is to be noted, however, that, since the present SOA gate array integrated device is reversed in terms of the input side and the output side of light (since the advancing direction of light is reversed) from that of the first embodiment described hereinabove, the single output channel optical waveguide portion 3 in the first embodiment described above becomes the single input channel optical waveguide portion (second channel optical waveguide portion) land the plural input channel optical waveguide portions 1 in the first embodiment described hereinabove become the plural output channel optical waveguide portions (first channel optical waveguide portions) 3. It is to be noted that, in FIGS. 4(A) and 4(B), like elements to those in the first embodiment [refer to FIGS. 1(A) and 1(B)] described hereinabove are denoted by like reference characters.

On the other hand, while the present SOA gate array integrated device is same in the structure of the dummy structure bodies 10 as that in the first embodiment described hereinabove, since the input side and the output side of light are reversed, the present SOA gate array integrated device is different in the arrangement of the dummy structure bodies 10.

Figure 5:
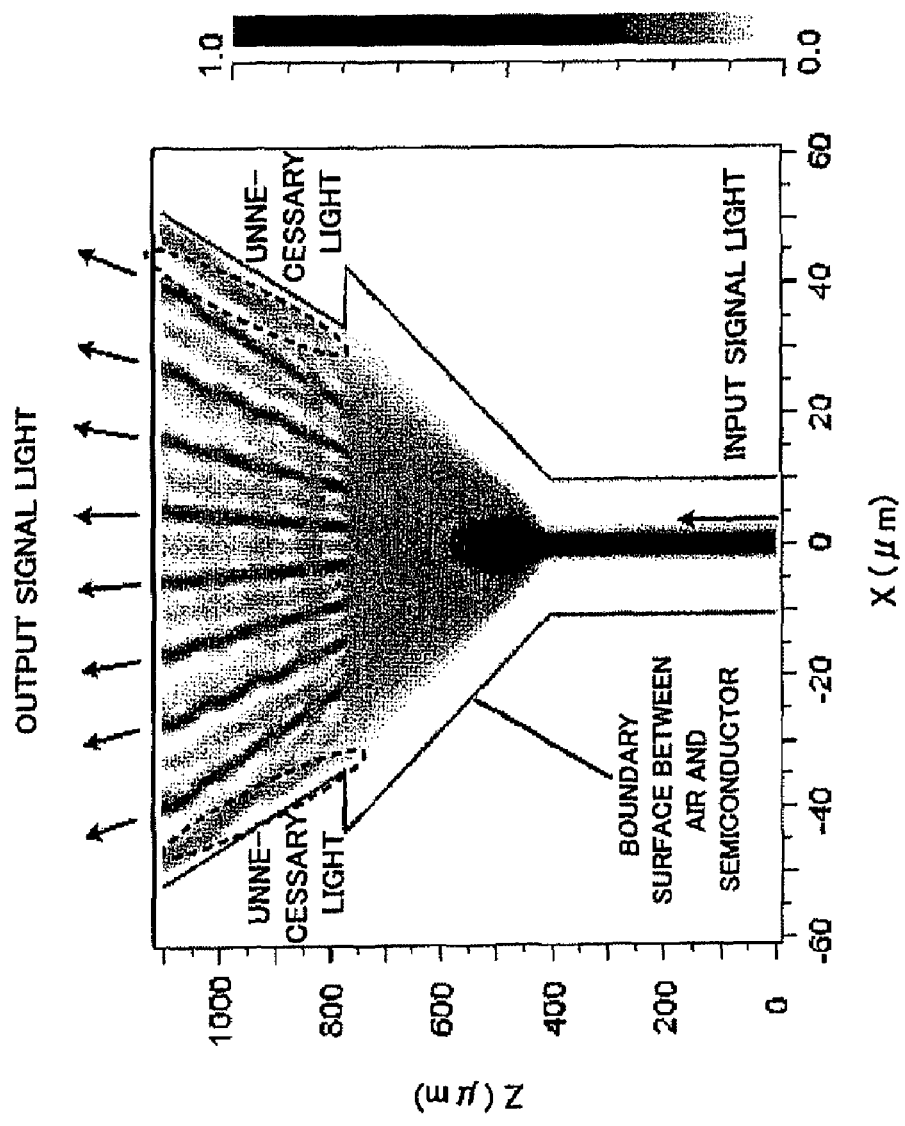
FIG. 5 is a view illustrating a result of simulation calculation of a manner of signal light propagation at and around an optical coupler portion of a 1-input 8-output SOA gate array integrated device having a conventional semi-insulating burying structure.

Here, FIG. 5 illustrates a result of simulation calculation of a manner of propagation of signal light around the optical coupler portion 2 carried out on a 1-input 8-output SOA gate array integrated device (which includes a 1×8-ch FFC coupler), which does not include any dummy structure bodies 10, by a BPM (Beam Propagation Method).

According to the result of the simulation calculation illustrated in FIG. 5, much unnecessary light can be observed between and on the opposite sides of the eight output channel optical waveguide portions 3.

In particular, the FFC coupler which forms the optical coupler portion 2 has, from a principle thereof, a mechanism wherein, where it is configured as a 1-input n-output FFC coupler, some radiation loss occurs (input power>total power of the n-output side), and a manner wherein radiation light of such radiation loss is guided along the output channel optical waveguide portions 3 in the inside of the burying layer 9 between the output channel optical waveguide portions 3 and in the inside of the burying layer 9 on the outer sides of the outermost output channel optical waveguide portions 3 (regions between the outermost output channel optical waveguide portions 3 and the air-semiconductor boundary surfaces).

Such unnecessary light (radiation light) as described above later becomes stray lights which advance along signal lights guided by the output channel optical waveguide portions 3, and finally advances into optical fibers connected to the output ports and deteriorates device characteristics.

Therefore, in the embodiment, a plurality of dummy structure bodies 10 are provided discretely (discontinuously) over a desired region on the opposite sides of the proximity of at least the output side of the optical coupler portion 2 as seen in FIG. 4(A). In particular, as seen in FIGS. 4(A) and 4(B), a plurality of dummy structure bodies 10 are provided discretely over a plurality of regions so that the inclined faces 9B of the burying layer 9 may not be formed in the proximity of at least the output side of the optical coupler portion 2 [that is, the boundary between the burying layer 9 and the air (inclined faces 9B of the semi-insulating semiconductor burying layer 9) may be formed at positions spaced by a desired distance from the proximity of at least the output side of the optical coupler portion 2].

In the embodiment, the plural dummy structure bodies 10 are provided discretely over a wide region from the proximity of the optical coupler portion 2 to the proximity of the side faces of the semiconductor substrate 5 as seen in FIG. 4(A).

Where the arrangement of the dummy structure bodies 10 is devised such that the dummy structure bodies 10 are distributed over a region from the proximity of the optical coupler portion 2 to the proximity of the device side faces of the optical coupler portion 2 in this manner, unnecessary light (radiation light) radiated from the optical coupler portion 2 can pass through the region in which the dummy structure bodies 10 are formed and can be excluded to the outside from locations (here, the device side faces) remote from the output ports formed on the device end face by the channel waveguide effect which the burying layer 9 formed around the dummy structure bodies 10 has.

Here, the plural dummy structure bodies 10 are arranged at such locations as seen in FIG. 4(A), and the inclined faces 9B (air-semiconductor boundary surfaces) of the burying layer 9 on the opposite sides of the waveguide array formed from the eight output channel optical waveguide portions 3 connected to the output side of the optical coupler portion 2 are spaced by a predetermined distance from the outermost ones of the eight output channel optical waveguide portions 3 as seen in FIGS. 4(A) and 4(B).

Consequently, unnecessary lights (unnecessary lights in regions indicated by broken lines in FIG. 6) which are guided along the output channel optical waveguide portions 3 in the inside of the burying layer 9 on the outer sides of the optical waveguide structure 4 which forms the outermost output channel optical waveguide portions 3 (regions between the output channel optical waveguide portions 3 and the air-semiconductor boundary surfaces).

In particular, the boundary of the burying layer 9 and the air (air-semiconductor boundary surface; inclined faces 9B of the burying layer 9), which is a main cause of the situation that unnecessary light (radiation light) from the optical coupler portion 2 is guided in the burying layer 9, is not formed in the proximity of at least the output side of the optical coupler portion 2. Consequently, the radiation light can be guided to a position spaced spatially from signal light (output signal light), which propagates along the output channel optical waveguide portions 3, and can be excluded to the outside. In this manner, it is possible to prevent the radiation light radiated from the optical coupler portion 2 into the burying layer 9 from being reflected by the air-semiconductor boundary surfaces and propagating toward the output end face side in the inside of the burying layer 9 formed along the optical waveguide structure 4 (output channel optical waveguide portions 3 and SOA portion 8) on the output side.

Figure 6:
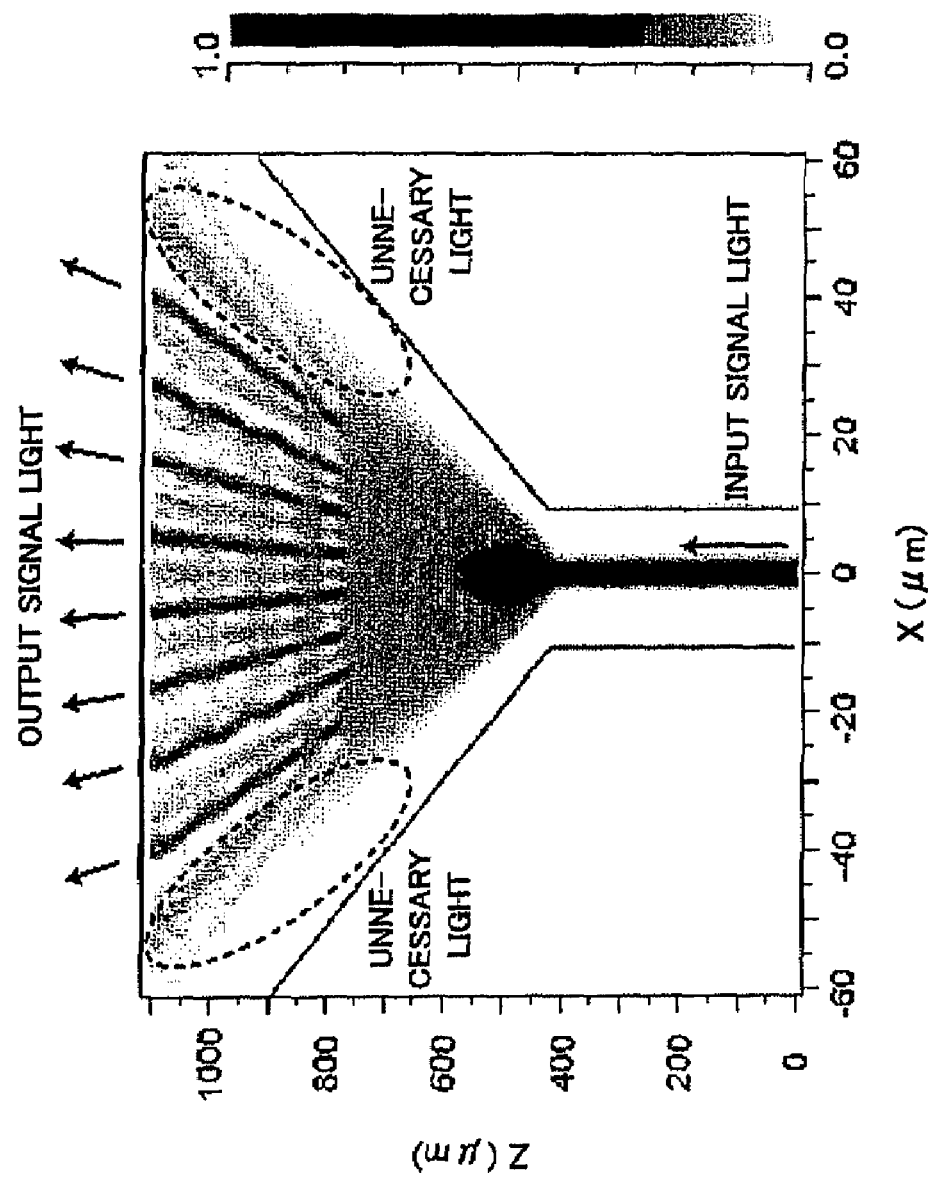
FIG. 6 is a view illustrating a result of simulation calculation of a manner of signal light propagation at and around an optical coupler portion of the optical integrated device (1-input 8-output SOA gate array integrated device) according to the second embodiment.
Figure 7:
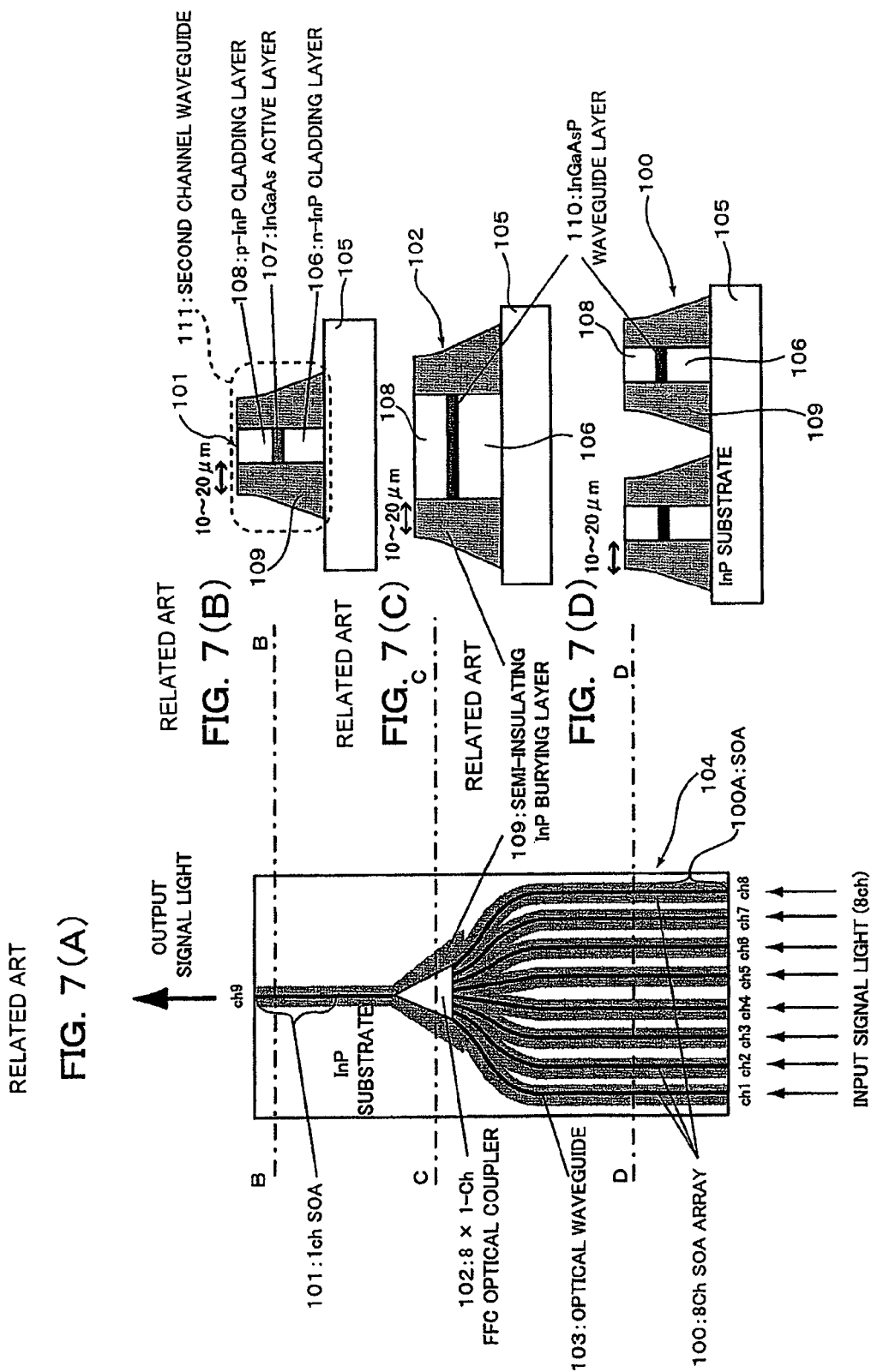

Here, FIG. 6 illustrates a result of simulation calculation of a manner of propagation of signal light around the optical coupler portion 2 carried out on a structure to which the present invention is applied [structure which includes the dummy structure bodies 10; refer to FIGS. 4(A) and 4(B)] by a BPM (Beam Propagation Method).

From FIG. 6, it can be seen that unnecessary light (radiation light) which has existed on the opposite sides of the waveguide array formed from the eight output channel optical waveguide portions 3 is dispersed to a wide region when compared with the calculation result (refer to FIG. 5) on the conventional structure (structure which does not include a dummy structure body). Then, by further introducing the unnecessary light to the device side faces, the unnecessary light can be spatially separated sufficiently from signal light which is guided in the inside of the output channel optical waveguide portions 3.

It is to be noted that the other part of the configuration and the fabrication method is same as that in the first embodiment described hereinabove, and overlapping description of the same is omitted herein.

Accordingly, with the optical integrated device of the embodiment, there is an advantage that, similarly to that of the first embodiment described hereinabove, the optical integrated device (SOA gate array integrated device) which includes the optical coupler portion 2 and has a burying structure by the semi-insulating semiconductor burying layer 9 can assure the flatness of the semi-insulating semiconductor burying layer 9 while such a phenomenon that radiation light generated from the optical coupler portion 2 mixes into signal light on the output side can be suppressed. Particularly where the optical integrated device is an SOA gate array integrated device and forms an SOA optical gate switch, the extinction ratio between on and off states (device extinction ratio: device characteristic) is improved.

[Others]

It is to be noted that, while, in the embodiments described above, an SOA optical gate switch is taken as an example of an optical integrated device, the optical integrated device is not limited to this, but the present invention can be applied widely to any optical integrated device only if it involves radiation light from an optical coupler portion. For example, the present invention can be applied also to an optical integrated device wherein a laser or an optical modulator is integrated in place of an SOA. Also the optical integrated device has an effect that a device characteristic can be improved.

Further, while, in the embodiments described above, the optical coupler portion 2 is formed from an FFC coupler as an example, the optical coupler portion 2 is not limited to this, but the present invention can be applied widely to any optical coupler portion from which radiation light is radiated. For example, the present invention can be applied to various optical integrated devices wherein the optical coupler portion is formed, for example, from an MMI (Multi-Mode Interfere) type coupler (for example, a plural-input 1-output coupler) or a star coupler. It is to be noted that, also in this instance, the optical integrated devices can be fabricated basically using such a method as described above.

Further, while, in the embodiments described above, arrangement examples of the dummy structure bodies 10 according to the input and output directions of light where the optical coupler portion 2 is formed from an FFC coupler are described [refer to FIGS. 1(A), 1(B), 4(A) and 4(B)], the arrangement of the dummy structure bodies 10 is not limited to them. Since the region in which unnecessary light (radiation light) is generated differs depending upon the structure of the optical coupler portion 2, the input and output directions of light and so forth, the arrangement of the dummy structure bodies 10 may be set in response to the structure of the optical coupler portion 2, the input and output directions of light and so forth.

Further, while, in the embodiments described hereinabove, the dummy structure bodies 10 have a layer structure same as that of the optical waveguide structure 4 (input channel optical waveguide portions or portion 1, output channel optical waveguide portion or portions 3 and optical coupler portion 2), the layer structure of the dummy structure bodies 10 is not limited to this. For example, the layer structure of the dummy structure bodies 10 may be same as the layer structure of the SOA portions 6 and 8 (structure which includes an active layer as the core layer). In particular, it is possible to set the layer structure of the dummy structure bodies 10 to the optical waveguide structure 4 and form the core layer of the same from a semiconductor material having a characteristic of absorbing radiation light (signal light).

With the structure described above, scattering of unnecessary light (radiation light) at the dummy structure bodies 10 is suppressed by a light absorbing effect of the active layer provided in the dummy structure bodies 10, and as a result, the device extinction ratio can be further improved.

The structure described can be implemented by modifying the fabrication methods of the embodiments described hereinabove such that the mask to be used when butt joint growth is carried out is changed such that a $SiO_2$ mask is formed not only above regions in which the SOA portions 6 and 8 are to be formed but also above locations at which the dummy structure bodies 10 are to be formed so that an active layer same as the SOA active layer 12 may remain also at the locations at which the dummy structure bodies 10 are to be formed. It is to be noted that it is easier to fabricate the layer structure of the dummy structure bodies 10 if it is same as that of the optical waveguide structures 1 and 3 as in the embodiments described hereinabove.

It is to be noted here that, although the core layer of the dummy structure bodies 10 is formed from a semiconductor material having a characteristic of absorbing radiation light, the core layer of the dummy structure bodies 10 is not limited to this, but the entire dummy structure bodies 10 may be formed from a semiconductor material having a characteristic of absorbing radiation light (signal light).

Further, while, in the embodiments described hereinabove, the SOA portions 6 and 8 have an active layer structure which includes an active layer and an SCH layer made of i-InGaAsP, the active layer structure of the SOA portions 6 and 8 is not limited to this. For example, the active layer structure of the SOA portions 6 and 8 may be changed, for example, in the material or composition or the film thickness, or an MQW (Multiple Quantum Well) structure or a quantum dot structure may be adopted to additionally provide various functions. Or, the active layer structure of the SOA portions 6 and 8 may not include any SCH layer. Also in those cases, devices having similar effects can be fabricated.

The present invention is not limited to the embodiments specifically described above, and variations and modifications can be made without departing from the scope of the present invention.

What is claimed is:

1. An optical integrated device, comprising:
an optical waveguide structure formed on a semiconductor substrate and including a plurality of first channel optical waveguide portions, an optical coupler portion and a second channel optical waveguide portion connected to said plural first channel optical waveguide portions through said optical coupler portion;
a plurality of dummy structure bodies being discretely provided over a desired region in the proximity of at least an output side of said optical coupler portion;
a semi-insulating semiconductor burying layer formed from a semi-insulating semiconductor material and formed around said optical waveguide structure and said dummy structure bodies such that an upper portion thereof forms a flat face having a predetermined width and a side portion thereof forms an inclined face having a predetermined angle with respect to said semiconductor substrate; and
a waveguide, formed from said semi-insulating semiconductor burying layer formed around said plurality of dummy structure bodies, guiding radiation light from said optical coupler portion toward a face other than an output end face outputting signal light which propagates along said first channel optical waveguide portions or said second channel optical waveguide portions.

2. The optical integrated device as claimed in claim 1, wherein said dummy structure bodies are provided such that the inclined face of said semi-insulating semiconductor burying layer is formed at a position spaced by a desired distance from a proximity of at least the output side of said optical coupler portion.

3. The optical integrated device as claimed in claim 1, wherein said dummy structure bodies are provided over a region from a proximity of said optical coupler portion to a proximity of a side face of said semiconductor substrate.

4. The optical integrated device as claimed in claim 1, wherein said plural dummy structure bodies are provided in a region wherein radiation lights from said optical coupler portion output, the radiation lights being separated from signal lights inputted individually from said plural first channel optical waveguide portions to said optical coupler portion.

5. The optical integrated device as claimed in claim 1, wherein said dummy structure bodies are disposed such that the distance between adjacent ones of said dummy structure bodies is approximately 10 μm to approximately 50 μm.

6. The optical integrated device as claimed in claim 1, wherein said dummy structure bodies are formed in a columnar shape.

7. The optical integrated device as claimed in claim 6, wherein said dummy structure bodies have a diameter substantially equal to or less than a width of said first channel optical waveguide portions or said second channel optical waveguide portion.

8. The optical integrated device as claimed in claim 1, wherein said dummy structure bodies have a layer structure same as that of said optical waveguide structure.

9. The optical integrated device as claimed in claim 1, wherein said dummy structure bodies is formed partly or entirely from a semiconductor material having a characteristic of absorbing the radiation light.

10. The optical integrated device as claimed in claim 1, wherein the semi-insulating semiconductor material is doped with an element forming a deep impurity level.

11. The optical integrated device as claimed in claim 1, wherein said plural first channel optical waveguide portions individually include a semiconductor optical amplifier having an electrode provided on a surface thereof, and a semiconductor optical amplifier gate array is formed from the plural semiconductor optical amplifiers.

12. The optical integrated device as claimed in claim 11, wherein said second channel optical waveguide portion includes a semiconductor optical amplifier.

* * * * *